US006381264B1

(12) United States Patent
Lomp et al.

(10) Patent No.: US 6,381,264 B1
(45) Date of Patent: Apr. 30, 2002

(54) EFFICIENT MULTIPATH CENTROID TRACKING CIRCUIT FOR A CODE DIVISION MULTIPLE ACCESS (CDMA) SYSTEM

(75) Inventors: Gary Lomp, Centerpot; Fatih Ozluturk, Port Washington, both of NY (US)

(73) Assignee: InterDigital Technology Corporation, Wilmington, DE (US)

(*) Notice: Subject to any disclaimer, the term of this patent is extended or adjusted under 35 U.S.C. 154(b) by 0 days.

(21) Appl. No.: 09/261,689

(22) Filed: Mar. 3, 1999

Related U.S. Application Data

(63) Continuation of application No. 08/669,771, filed on Jun. 27, 1996.
(60) Provisional application No. 60/000,775, filed on Jun. 30, 1995.

(51) Int. Cl.[7] .......................... H04B 15/00; H04K 1/00; H04L 27/30

(52) U.S. Cl. ...................... 375/149; 375/145; 375/367; 370/515

(58) Field of Search ................................. 375/149, 145, 375/134, 137, 367, 148, 362; 370/515, 516, 517

(56) References Cited

U.S. PATENT DOCUMENTS

| | | | |
|---|---|---|---|
| 4,092,601 A | * | 5/1978 | Lee et al. .................... 375/340 |
| 4,785,463 A | | 11/1988 | Janc et al. ...................... 375/1 |
| 4,901,307 A | | 2/1990 | Gilhousen et al. ............. 370/18 |

(List continued on next page.)

OTHER PUBLICATIONS

Franz Josef Hagmanns, Volker Hespelt, "Code Division Multiple Access (CDMA)"—8273 ANT Nachrichtentechnische Berichte (1993) Aug. , No. 10, Backnang, DE pp. 64–71.

Franz Josef Hagmanns, Volker Hespelt, "Code Division Multiple Access (CMDA)"—8273 ANT Nachrichtentechische Berichte (1993) Aug., No. 10, Backnang, DE pp. 64–71 an English translation of same.

*Primary Examiner*—Chi Pham
*Assistant Examiner*—Phuong Phu
(74) *Attorney, Agent, or Firm*—Volpe & Koenig, P.C.

(57) ABSTRACT

A multiple access, spread-spectrum communication tracking system includes apparatus which tracks a centroid of a transmitted code-division multiplexed (CDM) code sequence that is contaminated with multipath distortion. The apparatus includes an analog to digital converter which digitally samples the spread-spectrum channel signal to produce a sequence of sample values. The sample values are divided into a set of even-numbered sample values which correspond to early multipath signal components and the set of odd sample number values which correspond to the multipath signal components. The centroid tracking receiver generates a plurality of local code sequences, each of which is a code phase-shifted version of the transmitted code sequence. The centroid tracking receiver correlates each of the locally generated code sequences with the odd and even numbered sample values, respectively, to produce a group of early despread multipath signals and a group of late despread multipath signals. The group of early despread multipath signals are weighted and processed to produce an early tracking value, and the group of late despread multipath signals are weighted and processed to produce a late tracking value. The difference between the early tracking value and the late tracking value is calculated to produce an error signal value. Finally, the centroid tracking system adjusts the code phase of each of the locally generated code sequences to minimize the error signal value.

9 Claims, 5 Drawing Sheets

U.S. PATENT DOCUMENTS

| | | | |
|---|---|---|---|
| 5,022,049 A | 6/1991 | Abrahamson et al. | 375/1 |
| 5,081,643 A | 1/1992 | Schilling | 375/1 |
| 5,084,900 A | 1/1992 | Taylor | 375/1 |
| 5,093,840 A | 3/1992 | Schilling | 375/1 |
| 5,101,416 A | 3/1992 | Fenton et al. | 375/1 |
| 5,109,390 A | 4/1992 | Gilhousen et al. | 375/1 |
| 5,166,951 A | 11/1992 | Schilling | 357/1 |
| 5,193,094 A | 3/1993 | Viterbi | 371/43 |
| 5,204,876 A | 4/1993 | Bruckert et al. | 375/1 |
| 5,228,056 A | 7/1993 | Schilling | 375/1 |
| 5,237,586 A | 8/1993 | Bottomley | 375/1 |
| 5,241,690 A | 8/1993 | Larsson et al. | 455/54.1 |
| 5,245,629 A | 9/1993 | Hall | 375/1 |
| 5,253,268 A | 10/1993 | Omura et al. | 375/1 |
| 5,257,283 A | 10/1993 | Gilhousen et al. | 375/1 |
| 5,260,967 A | 11/1993 | Schilling | 375/1 |
| 5,265,119 A | 11/1993 | Gilhousen et al. | 375/1 |
| 5,267,262 A | 11/1993 | Wheatley, III et al. | 375/1 |
| 5,283,536 A | 2/1994 | Wheatley, III et al. | 330/279 |
| 5,295,152 A | 3/1994 | Gudmundson et al. | 375/1 |
| 5,299,226 A | 3/1994 | Schilling | 375/1 |
| 5,299,228 A | 3/1994 | Hall | 375/1 |
| 5,309,474 A | 5/1994 | Gilhousen et al. | 375/1 |
| 5,327,455 A | 7/1994 | DeGaudenzi et al. | 375/1 |
| 5,327,467 A | 7/1994 | DeGaudenzi et al. | 375/107 |
| 5,329,547 A | 7/1994 | Ling | 375/1 |
| 5,341,396 A | 8/1994 | Higgins et al. | 375/1 |
| 5,345,598 A | 9/1994 | Dent | 455/54.1 |
| 5,347,536 A | 9/1994 | Meehan | 375/1 |
| 5,349,606 A | 9/1994 | Lovell et al. | 375/1 |
| 5,377,183 A | 12/1994 | Dent | 370/18 |
| 5,390,207 A | 2/1995 | Fenton et al. | 375/1 |
| 5,392,287 A | 2/1995 | Tiedemann, Jr. et al. | 370/95.1 |
| 5,396,516 A | 3/1995 | Padovani et al. | 375/225 |
| 5,404,376 A | 4/1995 | Dent | 375/200 |
| 5,414,728 A | 5/1995 | Zehavi | 375/200 |
| 5,414,729 A | 5/1995 | Fenton | 375/209 |
| 5,416,797 A | 5/1995 | Gilhousen et al. | 375/705 |
| 5,420,896 A | 5/1995 | Schilling | 375/205 |
| 5,422,908 A | 6/1995 | Schilling | 375/203 |
| 5,430,724 A | 7/1995 | Fall et al. | 370/79 |
| 5,430,760 A | 7/1995 | Dent | 375/200 |
| 5,440,597 A | 8/1995 | Chung et al. | 375/200 |
| 5,442,662 A | 8/1995 | Fukasawa et al. | 375/205 |
| 5,446,683 A | 8/1995 | Mullen et al. | 364/717 |
| 5,528,624 A | 6/1996 | Kaku et al. | 375/206 |
| 5,535,278 A | 7/1996 | Cahn et al. | 380/49 |
| 5,541,606 A | 7/1996 | Lennen | 342/357 |
| 5,544,156 A | 8/1996 | Teder et al. | 370/18 |
| 5,548,613 A | 8/1996 | Kaku et al. | 375/208 |
| 5,550,811 A | 8/1996 | Kaku et al. | 370/8 |
| 5,559,790 A | 9/1996 | Yano et al. | 370/18 |
| 5,570,349 A | 10/1996 | Bustamante et al. | 370/18 |
| 5,574,754 A * | 11/1996 | Kurihara et al. | 375/367 |
| 5,621,416 A | 4/1997 | Lennen | 342/357 |
| 5,673,286 A * | 9/1997 | Lomp | 375/208 |
| 5,712,869 A | 1/1998 | Lee et al. | 375/206 |
| 5,912,919 A * | 6/1999 | Lomp et al. | 375/208 |
| 5,966,403 A * | 10/1999 | Pon | 375/208 |
| 6,272,168 B1 * | 8/2001 | Lomp et al. | 375/206 |
| 6,289,040 B1 * | 9/2001 | Molev-Shteiman | 375/149 |

* cited by examiner

EFFICIENT MULTIPATH CENTROID TRACKING CIRCUIT FOR A CODE DIVISION MULTIPLE ACCESS (CDMA) SYSTEM

CROSS REFERENCE TO RELATED APPLICATIONS

This patent is a continuation of U.S. patent application Ser. No. 08/669,771, filed Jun. 27, 1996, which claims priority from U.S. Provisional Application 60/000,775 filed Jun. 30, 1995.

BACKGROUND OF THE INVENTION

The present invention generally pertains to code sequence tracking in Code Division Multiple Access (CDMA) communication systems, also known as spread-spectrum communication systems. More particularly, the present invention pertains to a system and method for efficient tracking of multipath signal components allowing for combining of multipath signal components to improve data signal detection and despreading by reducing effects of multipath interference, and increase CDMA communication system efficiency by reducing the required transmit power.

DESCRIPTION OF THE RELEVANT ART

Providing quality telecommunication services to user groups which are classified as remote, such as rural telephone systems and telephone systems in underdeveloped countries, has proved to be a challenge over recent years. The past needs created by these services have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Usually, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users. Spread spectrum modulation refers to modulating a information signal with a spreading code signal; the spreading code signal being generated by a code generator where the period, Tc, of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence spreading (DS). Spread-spectrum modulation produces a signal with bandwidth substantially greater than that required to transmit the information signal. The original information is recovered by synchronously demodulating and despreading of the signal at the receiver. The synchronous demodulator uses a reference signal to synchronize the despreading circuits to the input spread-spectrum modulated signal to recover the carrier and information signals. The reference signal may be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which is incorporated herein by reference.

One area in which spread-spectrum techniques are used is in the field of mobile cellular communications to provide personal communication services (PCS). Such systems desirably support large numbers of users, control Doppler shift and fade, and provide high speed digital data signals with low bit error rates. These systems employ a family of orthogonal or quasi-orthogonal spreading codes, with a pilot spreading code sequence that is synchronized to the family of codes. Each user is assigned one of the spreading codes from the family as a spreading function. Related problems of such a system include handling multipath fading effects. Solutions to such problems include diversity combining of multipath signals. The problems associated with spread spectrum communications, and methods to increase capacity of a multiple access, spread-spectrum system are described in U.S. Pat. No. 4,901,307 entitled SPREAD SPECTRUM MULTIPLE ACCESS COMMUNICATION SYSTEM USING SATELLITE OR TERRESTRIAL REPEATERS by Gilhousen et al. which is incorporated herein by reference.

The problems associated with the prior art systems focus around reliable reception and synchronization of the receiver despreading circuits to the received signal. The presence of multipath fading introduces a particular problem with spread spectrum receivers in that a receiver must somehow track the multipath components to maintain code-phase lock of the receiver's despreading means with the input signal. Prior art receivers generally track only one or two of the multipath signals, but this method may not be satisfactory because the combined group of low-power multipath signal components may actually contain far more power than the one or two strongest multipath components. The prior art receivers track and combine only the strongest components to maintain a predetermined Bit Error Rate (BER) of the receiver. Such a receiver is described, for example, in U.S. Pat. No. 5,109,390 entitled DIVERSITY RECEIVER IN A CDMA CELLULAR TELEPHONE SYSTEM by Gilhousen et al. which is incorporated herein by reference. A receiver that combines all multipath components, however, is able to maintain the desired BER with a signal power that is lower than that of prior art systems because more signal power is available to the receiver. Consequently, there is a need for a spread spectrum communication system employing a receiver that tracks substantially all of the multipath signal components, so that substantially all multipath signals may be combined in the receiver. This would reduce the required transmit power of the signal for a given BER.

SUMMARY OF THE INVENTION

The present invention is embodied in a multiple access, spread-spectrum communication tracking system which processes a plurality of multipath signal components of a code-division-multiplexed (CDM) signal received over a radio frequency (RF) channel. The system and method tracks a centroid of a group of multipath spread-spectrum signal components constituting a spread-spectrum channel signal which includes a transmitted code sequence. The exemplary system and method operate by digitally sampling the spread-spectrum channel signal to produce a sequence of sample values. The sample values are divided into a set of even-numbered sample values which define a sequence of early spread-spectrum channel signal samples corresponding to the early multipath signal components and a set of odd sample number values which define a sequence of late spread-spectrum channel signal samples corresponding to the late multipath signal components The centroid tracking receiver generates a plurality of local code sequences, each of which has a code phase and symbol period, and each of which is a code phase-shifted version of the transmitted code sequence. The centroid tracking receiver correlates each of the locally generated code sequences with the sequence of early received spread-spectrum channel signal samples to produce a group of early despread multipath signals. The tracking receiver also correlates each of the locally generated code sequences with the sequence of late received spread-spectrum channel signal samples to produce a group of late despread multipath signals. The group of early despread multipath signals are weighted according; to a predetermined algorithm and processed to produce an early tracking value, and the group of late despread multipath signals are similarly weighted and processed to produce a late tracking value.

The difference between the early tracking value and the late tracking value is calculated to produce an error signal value. Finally, the centroid tracking system adjusts the code phase of each of the locally generated code sequences responsive to the error signal value to maintain the maximum received signal energy.

DESCRIPTION OF THE EXEMPLARY EMBODIMENT

General

Three CDMA spreading-code tracking methods in multipath fading environments are described which track the code phase of a received multipath spread-spectrum signal. The first is the prior art tracking circuit which simply tracks the spreading code phase with the highest detector output signal value, the second is a tracking circuit that tracks the median value of the code phase of the group of multipath. signals, and the third, the system and method of the present invention, is the centroid tracking circuit which tracks the code-phase of an optimized, least mean squared weighted average of the multipath signal components. The following describes the methods by which the spreading code phase of the received CDMA signal is tracked.

Spreading Code Tracking as Part of the CDMA Receiver

Figure 1:
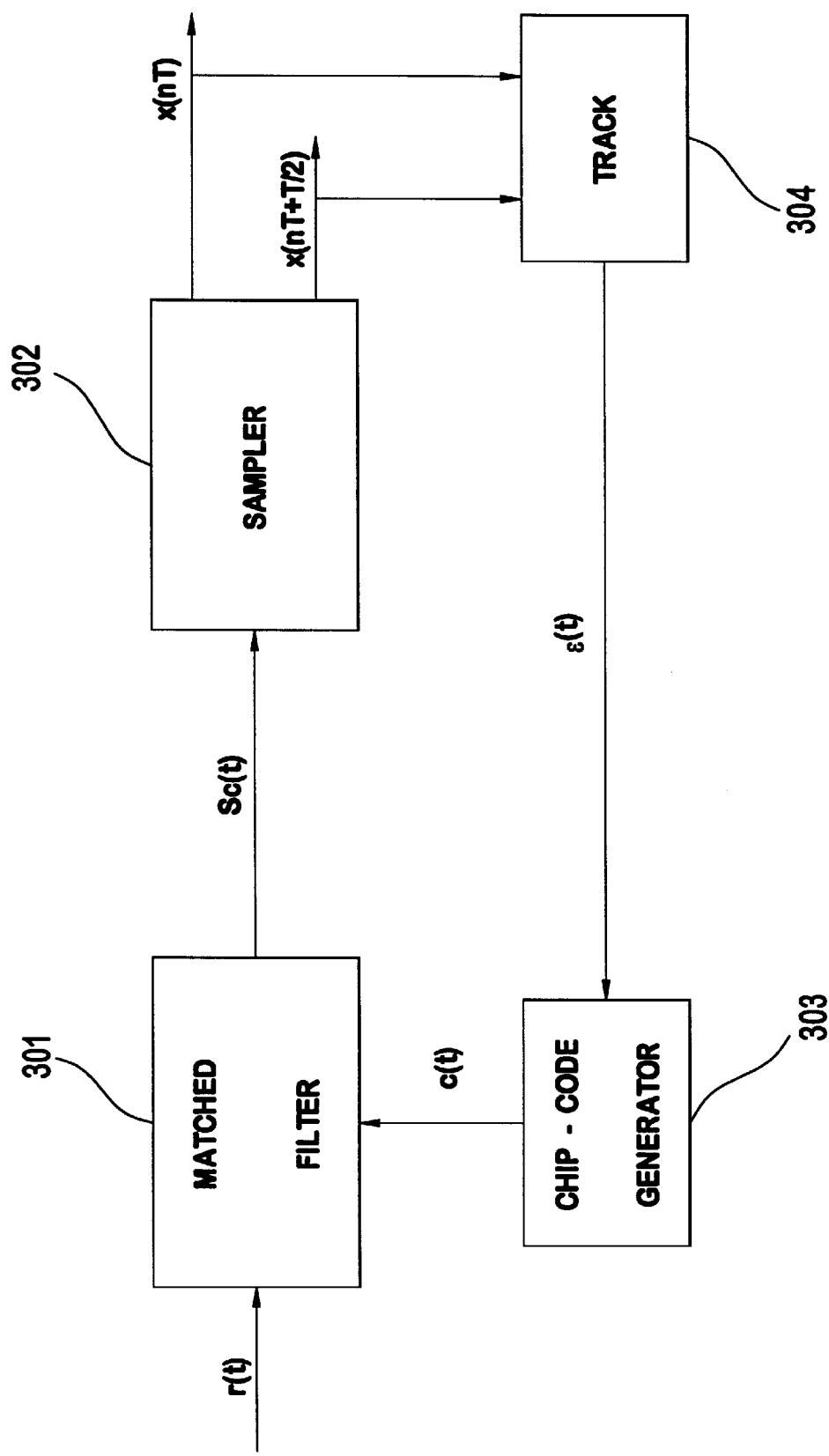
FIG. 1 is a block diagram of exemplary circuitry which implements the method of tracking the received spreading-code phase.

A tracking circuit has operating characteristics that reveal the relationship between the time error and the control voltage that drives a Voltage Controlled Oscillator (VCO) of a spreading-code phase tracking circuit. When there is a positive timing error, the tracking circuit generates a negative control voltage to offset the timing error. When there is a negative timing error, the tracking circuit generates a positive control voltage to offset the timing error. When the tracking circuit generates a zero value, this value corresponds to the perfect time alignment called the 'lock-point'. FIG. 1 shows the basic tracking circuit. Received signal r(t) is applied to matched filter 301, which correlates r(t) with a local code-sequence c(t) generated by Code Generator 303. The output signal of the matched filter x(t) is sampled at the sampler 302 to produce samples x[nT] and x[nT+T/2]. The samples x[nT] and x[nT+T/2] are used by a tracking circuit 304 to determine if the phase of the spreading-code c(t) of the code generator 303 is correct. The tracking circuit 304 produces an error signal e(t) as an input to the code generator 303. The code generator 303 uses this signal e(t) as an input signal to adjust the code-phase it generates.

Figure 2:
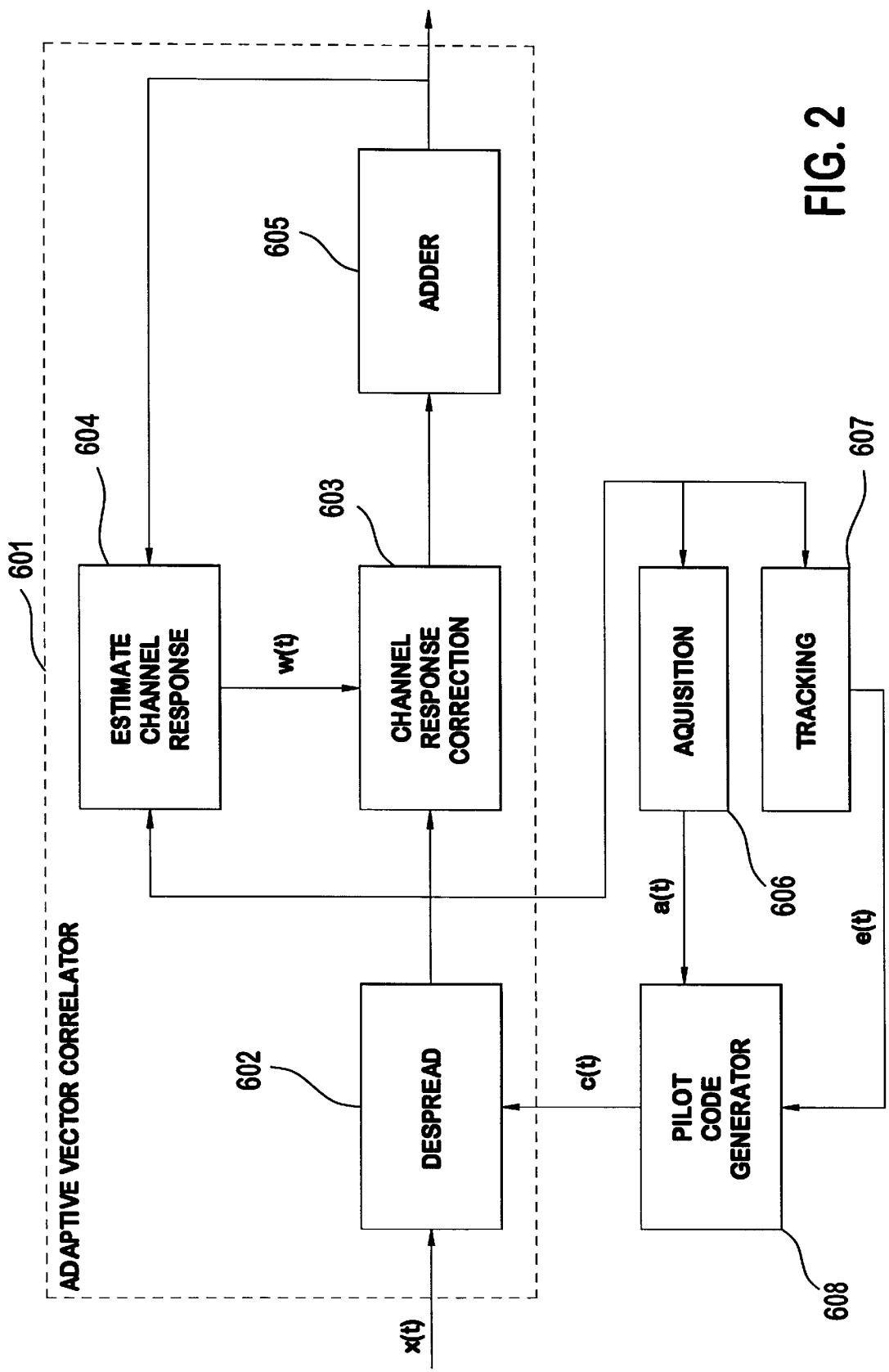
FIG. 2 is a block diagram of exemplary circuitry which implements the acquisition decision method of the correct spreading-code phase of the received pilot code of the present invention.

FIG. 2 shows the tracking circuit as it is typically used in a code division multiple access (CDMA) system receiver which uses an adaptive vector correlator (AVC) to estimate the channel impulse response and to obtain a reference value for coherent combining of received multipath signal components. For this type of system, a pilot signal is transmitted as a synchronization reference to all receivers. The described system receiver employs an array of correlators to estimate the complex channel response affecting each multipath component, the receiver then compensates for the channel response and coherently combines the received multipath signal components. This approach is referred to as maximal ratio combining.

Referring to FIG. 2, the input signal x(t) to the system includes interference noise of other message channels, multipath signals of message channels, thermal noise, and multipath signals of the pilot signal. The input signal is provided to AVC 601 which includes a despreading means 602, channel estimation means for estimating the channel response 604, correction means for correcting a signal for effects of the channel response 603, and adder 605 in the present invention. The AVC despreading means 602 is composed of multiple code correlators, with each correlator using a different phase of the pilot code c(t) provided by the pilot code generator 608. The output of this despreading means corresponds to a noise power level if the phase of the local pilot code of the despreading means is not in phase with the input code signal, or it corresponds: to a received pilot signal power level plus noise power level if the input pilot code and locally generated pilot code have the same phase. The output signals of the correlators of the despreading means are corrected for the channel response by the correction means 603 and are applied to the adder 605 which collects all multipath pilot signal power. The channel response estimation means 604 receives the combined pilot signal and the output signals of the despreading means 602, and provides a channel response estimate signal, w(t), to the correction means 603 of the AVC. The output signal of the despreading means 602 is also provided to the acquisition decision means 606 which decides, based on a particular algorithm such as a sequential probability ratio test (SPRT), if the present output levels of the despreading circuits correspond to synchronization of the locally generated code to the desired input code phase. If the detector finds no synchronization, then the acquisition decision means sends a control signal a(t) to the local pilot code generator 608 to offset its phase by one or more chip period. When synchronization is found, the acquisition decision means informs tracking circuit 607, which achieves and maintains a close synchronization between the received and locally generated code sequences.

Spreading Code Tracking

In a CDMA system, the signal, s(t), shown in equation (1) transmitted by the reference user is written in the low-pass representation as $$s(t) = \sum_{k=-\infty}^{\infty} c_k P_{Tc}(t - kT_c) \quad (1)$$

where $c_k$ represents the spreading code coefficients, $P_{Tc}(t)$ represents the spreading code chip waveform, and $T_c$ is the chip duration. Assuming that the reference user is not transmitting data, only the spreading code modulates the carrier. Referring to FIG. 1, the received signal, r(t), is described by Equation (2)

$$r(t) = \sum_{i=1}^{M} a_i s(t - \tau_i) \quad (2)$$

In Equation (2), $a_i$ is an attenuation factor due to fading effect of the multipath channel on the i-th path and $\tau_i$ is the random time delay associated with the same path. The receiver passes the received signal through a matched filter, which is implemented as a correlation receiver and is described below. This operation is done in two steps: first the signal is passed through a chip matched filter and sampled to recover the spreading code chip values, then this spreading sequence is correlated with the locally generated code sequence.

FIG. 1 shows the chip matched filter 301, matched to the chip waveform $P_{Tc}(t)$, and the sampler 302. The signal x(t) at the output terminal of the chip matched filter is given by equation (3), $$x(t) = \sum_{i=k}^{M} \sum_{k=-\infty}^{\infty} a_i c_k g(t - \tau_i - kT_c) \quad (3)$$

where $$g(t) = P_{Tc}(t) * h_R(t) \quad (4)$$

Here, $h_R(t)$ is the impulse response of the chip matched filter and '*' denotes convolution. By changing the order of the summations, equation (3) can be rewritten as equation (5), $$x(t) = \sum_{k=-\infty}^{\infty} c_k f(t - kT_c) \quad (5)$$

where $$f(t) = \sum_{i=1}^{M} a_i g(t - \tau_i) \quad (6)$$

In the multipath channel described above, the sampler samples the output signal of the matched filter to produce x(nT) at the maximum power level points of g(t). In practice, however, the waveform g(t) may be distorted due to the multipath signal reception, and a perfect time alignment of the signals may not be available.

When the multipath distortion in the channel is negligible and a perfect estimate of the timing is available, i.e., $a_1=1$, $\tau_1=0$, and $a_i=0$, i=2, ..., M, the received signal is r(t)=s(t). Then, with this ideal channel model, the output of the chip matched filter becomes $$x(t) = \sum_{k=-\infty}^{\infty} c_k g(t - kT_c) \quad (7)$$

When there is multipath fading, however, the received spreading code chip value waveform is distorted, and has a number of local maxima that can change from one sampling interval to another depending on the channel characteristics.

For multipath fading channels with quickly changing channel characteristics, it is not practical to try to locate the maximum of the waveform f(t) in every chip period interval. Instead, a time reference can be obtained from the characteristics of f(t) that may not change as quickly. Three tracking methods are described based on different characteristics of Prior Art Spreading Code Sequence Tracking Method:

Prior art tracking methods include a code tracking circuit in which the receiver attempts to determine the maximum matched filter output value of the chip waveform and sample the signal at that point. However, in multipath fading channels, the receiver despread spreading-code waveform can have a number of local maxima, especially in a mobile environment. In the following, f(t) represents the received signal waveform of the spreading code chip convolved with the channel impulse response. The frequency response characteristic of f(t) and the timing of its maximum correlation can change rather quickly making it impractical to track the maximum of f(t).

Define $\tau$ to be the time estimate that the tracking circuit calculates during a particular sampling interval. Also, define the following error function $$\varepsilon = \begin{cases} \int_{|t-t-\delta|} f(t)dt & |\tau - t| > \delta \\ \varepsilon = 0 & |\tau - t| < \delta \end{cases} \quad (8)$$

The tracking circuits of the prior art calculate a value of the input signal that minimizes the error $\epsilon$. One can write $$\min \varepsilon = 1 - \max_{\tau} \int_{\tau-\delta}^{\tau+\delta} f(t)dt \quad (9)$$

Assuming f(t) has a smooth frequency response characteristic in to the values given, the value of T for which f(t) is maximum minimizes the error $\epsilon$, so the tracking circuit tracks the maximum point of f(t).

Median Weighted Value Tracking Method:

The Median Weighted Tracking Method minimizes the absolute weighted error, defined as, $$\varepsilon = \int_{-\infty}^{\infty} |t - \tau| f(t)dt \quad (10)$$

This tracking method calculates the 'median' signal value of f(t) by collecting information from all paths, where f(t) is as in equation (6). In a multipath fading environment, the waveform f(t) can have multiple local maxima, but only one median.

To minimize $\epsilon$, the derivative of equation (10) is taken with respect to $\tau$ and is equated it to zero, which yields equation (11).

$$\int_{-\infty}^{\tau} f(t)dt = \int_{\tau}^{\infty} f(t)dt \qquad (11)$$

Figure 3:
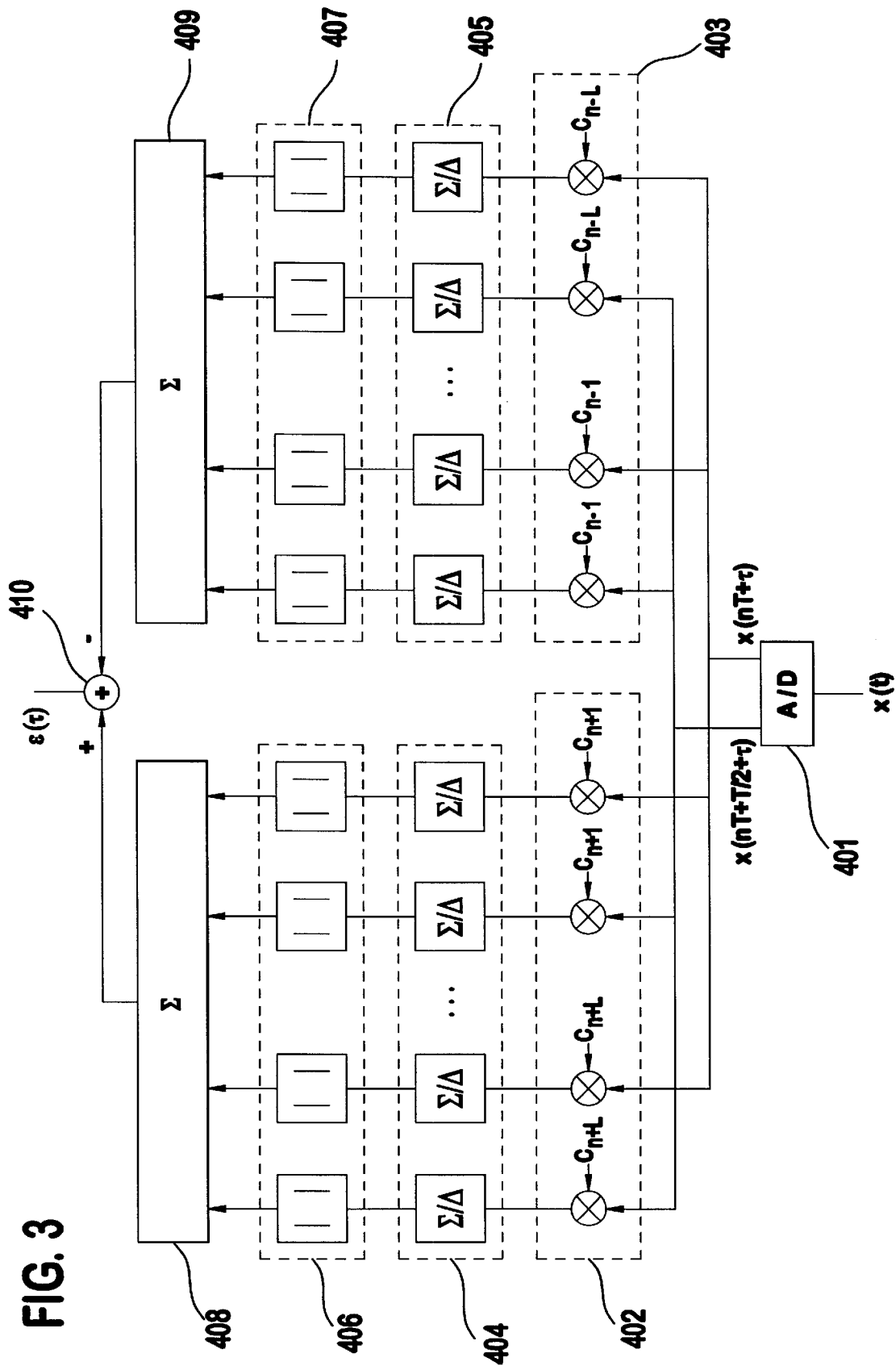
FIG. 3 is a block diagram of the tracking circuit that tracks the median of the received multipath signal components.

The value of $\tau$ that satisfies (11) is called the 'median' of f(t). Therefore, the Median Tracking Method of the present embodiment tracks the median of f(t). FIG. 3 shows an implementation of the tracking circuit based on minimizing the absolute weighted error defined above. The signal x(t) and its one-half chip offset version x(t+T/2) are sampled by the A/D 401 at a rate 1/T. Equation (12) determines the operating characteristic of the circuit in FIG. 3:

$$\varepsilon(\tau) = \sum_{n=1}^{2L} |f(\tau - nT/2)| - |f(\tau + nT/2)| \qquad (12)$$

Tracking the median of a group of multipath signals keeps the received energy of the multipath signal components equal on the early and late sides of the median point of the correct locally generated spreading-code phase $c_n$. The tracking circuit consists of an A/D converter 401 which samples an input signal x(t) to form the half chip offset samples. The half chip offset samples are alternatively grouped into even samples called an early set of samples x(nT+$\tau$) and odd samples called a late set of samples x(nT+(T/2)+$\tau$). The first correlation bank adaptive matched filter 402 multiplies each early sample by the spreading-code phases c(n+1), c(n+2), ..., c(n+L), where L is small compared to the code length and approximately equal to number of chips of delay between the earliest and latest multipath signal. The output of each correlator is applied to a respective first sum-and-dump bank 404. The magnitudes of the output values of the L sum-and-dump circuits are calculated in the calculator 406 and then summed in summer 408 to give an output value proportional to the signal energy in the early multipath signals. Similarly, a second correlation bank adaptive matched filter 403 operates on the late samples, using code phases c(n−1), c(n−2), ..., c(n−L), and each output signal is applied to a respective sum-and-dump circuit in an integrator 405. The magnitudes of the output signals of the L sum-and-dump circuits are calculated in calculator 407 and then summed in summer 409 to give a value for the late multipath signal energy. Finally, the adder 410 calculates the difference and produces error signal $\epsilon(\tau)$ of the early and late signal energy values.

The tracking circuit adjusts by means of error signal $\epsilon(\tau)$ the locally generated code phases c(t) to cause the difference between the early and late values to tend toward 0.

Centroid Tracking Method of the Present Invention

The optimal spreading-code tracking circuit of one embodiment of the present invention is called the squared weighted tracking (or centroid) circuit. Defining $\tau$ to denote the time estimate that the tracking circuit 1t) calculates, based on some characteristic of f(t), the centroid tracking circuit minimizes the squared weighted error defined as $$\varepsilon = \int_{-\infty}^{\infty} |t - \tau|^2 f(t) dt \qquad (13)$$

This function inside the integral has a quadratic form, which has a unique minimum. The value of $\tau$ that minimizes $\epsilon$ can be found by taking the derivative of the above equation with respect to $\tau$ and equating to zero, which gives $$\int_{-\infty}^{\infty} (-2t + 2\tau) f(t) dt = 0 \qquad (14)$$

Therefore, the value of $\tau$ that satisfies $$\tau - \frac{1}{\beta} \int_{-\infty}^{\infty} t f(t) dt = 0 \qquad (15)$$

is the timing estimate that the tracking circuit calculates, and $\beta$ is a constant value.

Figure 4:
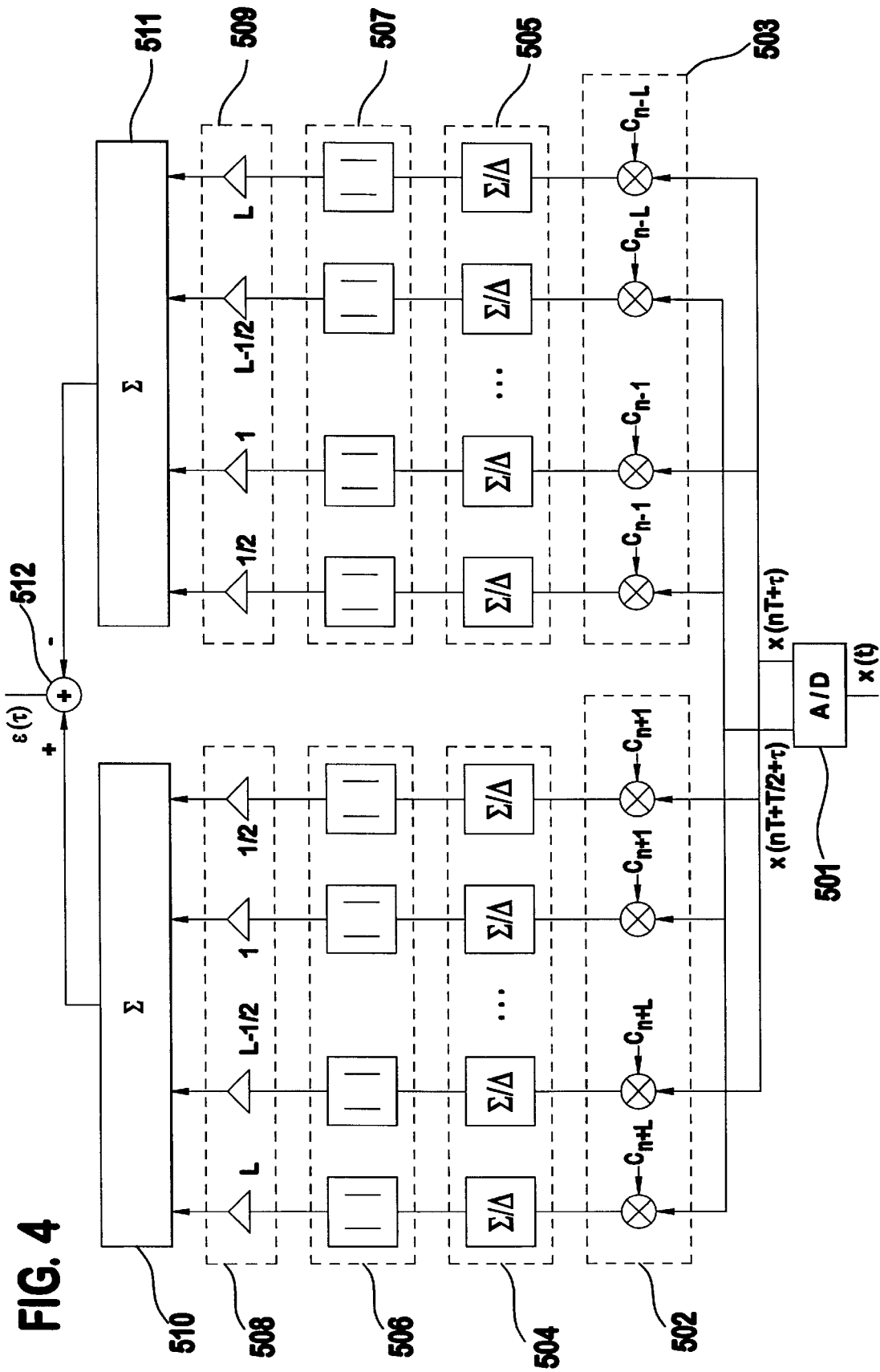
FIG. 4 is a block diagram of the tracking circuit that tracks the centroid of the received multipath signal components.

Based on these observations, a realization of the tracking circuit of the present invention minimizing the squared weighted error is shown in FIG. 4. The following equation determines the error signal $\epsilon(\tau)$ of the centroid tracking circuit:

$$\varepsilon(\tau) = \sum_{n=1}^{2L} n[|f(\tau - nT/2)| - |f(\tau + nT/2)|] = 0 \qquad (16)$$

The value that satisfies $\epsilon(\tau)=0$ is the perfect estimate of the timing.

The early and late multipath signal energy on each side of the centroid point are equal. The centroid tracking circuit shown in FIG. 4 consists of an A/D converter 501 which samples an input signal x(t) to form the half chip offset samples. The half chip offset samples are alternatively grouped as an early set of samples x(nT+$\tau$) and a late set of samples x(nT+(T/2)+$\tau$). The first correlation bank adaptive matched filter 502 multiplies each early sample and each late sample by the positive spreading-code phases c(n+1), c(n+2), ..., c(n+L), where L is small compared to the code length and approximately equal to number of chips of delay between the earliest and latest multipath signal. The output signal of each correlator is applied to a respective one of L sum-and-dump circuits of the first sum and dump bank 504. The magnitude value of each sum-and-dump circuit of the sum and dump bank 504 is calculated by the respective calculator in the calulator bank 506 and applied to a corresponding weighting amplifier of the first weighting bank 508. The output signal of each weighting amplifier represents the weighted signal energy in a multipath component signal.

The weighted early multipath signal energy values are summed in sample adder 510 to give an output value proportional to the signal energy in the group of multipath signals corresponding to positive code phases which are the early multipath signals. Similarly, a second correlation bank adaptive matched filter 503 operates on the early and late samples, using the negative spreading phases c(n−1), c(n−2), ..., c(n−L), each output signal is provided to a respective sum-and-dump circuit of discrete integrator 505. The magnitude value of the L sum-and-dump output signals is calculated by the respective calculator of calculator bank 507 and then weighted in weighting bank 509. The weighted late multipath signal energy values are summed in sample adder 511 to give an energy value for the group of multipath signals corresponding to the negative code phases which are the late multipath signals. Finally, the adder 512 calculates the difference between the early and late signal energy values to produce error sample value $\epsilon(\tau)$.

The tracking circuit of FIG. 4 produces error signal $\epsilon(\tau)$ which is used to adjust the locally generated code phase c(nT) to keep the weighted average energy in the early and late multipath signal groups equal. The embodiment shown uses weighting values that increase as the distance from the centroid increases. The signal energy in the earliest and latest multipath signals is probably less than the multipath signal values near the centroid. Consequently, the difference calculated by the adder 510 is more sensitive to variations in delay of the earliest and latest multipath signals.

Quadratic Detector for Tracking

In the another embodiment of the tracking method, the tracking circuit adjusts sampling phase to be "optimal" and robust to multipath. Let f(t) represent the received signal waveform as in equation 16 above. The particular method of optimizing starts+with a delay locked loop with an error signal $\epsilon(\tau)$ that drives the loop. The function $\epsilon(\tau)$ must have only one zero at $\tau=\tau_0$ where $\tau_0$ is optimal. The optimal form for $\epsilon(\tau)$ has the canonical form $$\varepsilon(\tau) = \int_{-\infty}^{\infty} w(t, \tau) |f(t)|^2 dt \tag{17}$$

where w(t, $\tau$) is a weighting function relating f(t) to the error $\epsilon(\tau)$, and the following holds $$\varepsilon(\tau + \tau_0) = \int_{-\infty}^{\infty} w(t, \tau + \tau_0) |f(t)|^2 dt \tag{18}$$

It follows from equation 18 that w(t, $\tau$) is equivalent to w(t–$\tau$). Considering the slope M of the error signal in the neighborhood of a lock point $\tau_0$:

$$M = \left.\frac{d\varepsilon(\tau)}{d\tau}\right|_{\tau_0} = -\int_{-\infty}^{\infty} w'(t - \tau_0) g(t) dt \tag{19}$$

where w'(t, $\tau$) is the derivative of w(t, $\tau$) with respect to $\tau$, and g(t) is the average of $|f(t)|^2$.

The error $\epsilon(\tau)$ has a deterministic part and a noise part. Let z denote the noise component in $\epsilon(\tau)$, then $|Z|^2$ is the average noise power in the error function $\epsilon(\tau)$. Consequently, the optimal tracking circuit maximizes the ratio $$F = \frac{M^2}{|z|^2} \tag{20}$$

Figure 5:
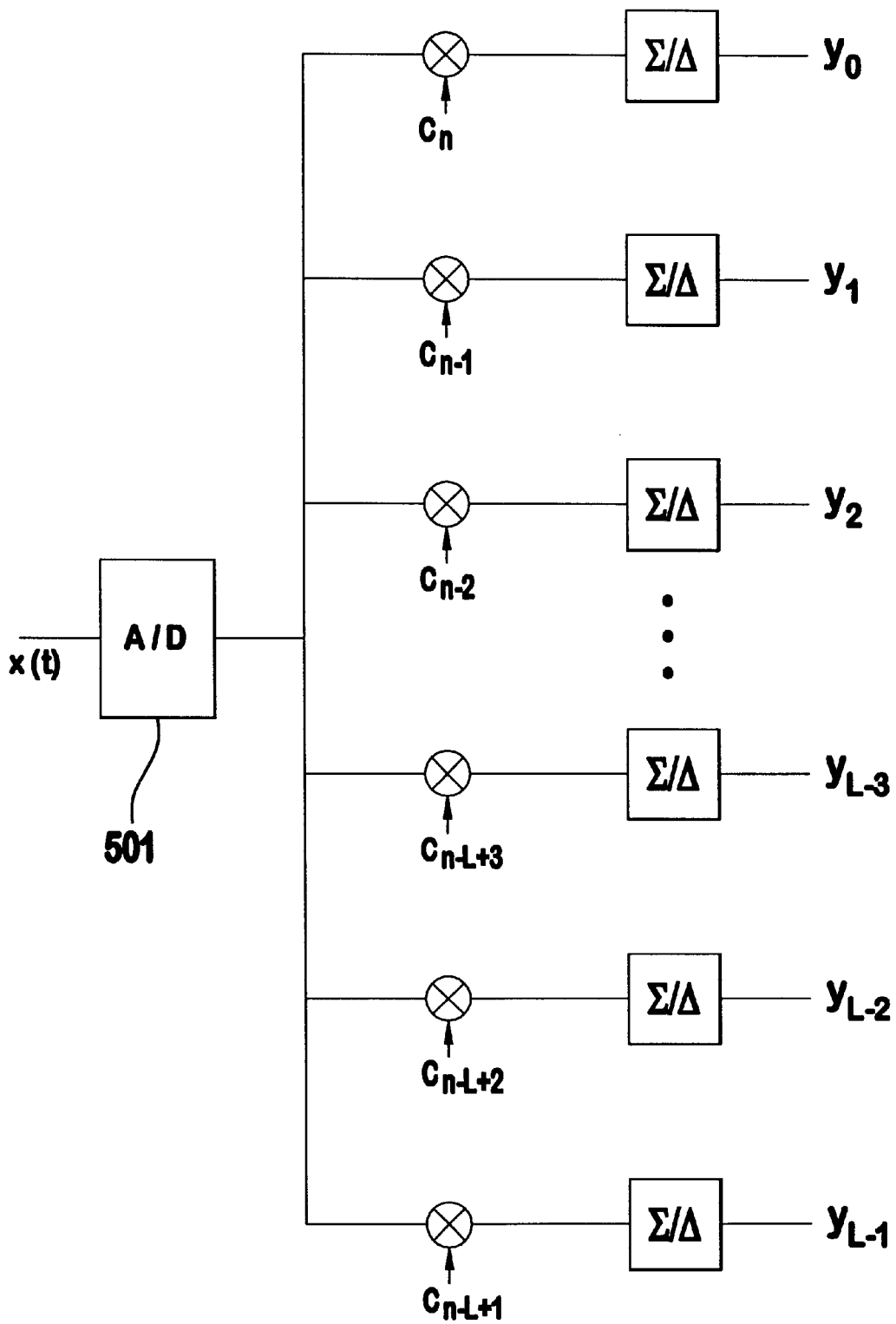
FIG. 5 is a block diagram of the correlating circuit which creates a tracking vector signal for a generalized quadratic tracking detector.

The implementation of the Quadratic Detector is now described. The discrete error value e of an error signal $\epsilon(\tau)$ is generated by performing the operation $$e = y^T B y \tag{21}$$

where the vector y represents the received signal components yi, i=0, 1, ... L-1, as shown in FIG. 5. The matrix B is an L by L matrix and the elements are determined by calculating values such that the ratio F of equation 20 is maximized.

The Quadratic Detector described above may be used to implement the centroid tracking system described above with reference to FIG. 4. For this implementation, the vector y is the output signal of the sum and dump circuits 504: y={f($\tau$–LT), f($\tau$–LT+T/2), f($\tau$–(L–1)T), ... f($\tau$), f($\tau$+T/2), f($\tau$+T), ... f($\tau$+LT)} and the matrix B is set forth in Table 1.

TABLE 1

B matrix for quadratic form of Centroid Tracking System

| L | 0 | 0 | 0 | 0 | 0 | 0 | 0 | 0 | 0 | 0 |
|---|---|---|---|---|---|---|---|---|---|---|---|
| 0 | L – 1/2 | 0 | 0 | 0 | 0 | 0 | 0 | 0 | 0 | 0 |
| 0 | 0 | L – 1 | 0 | 0 | 0 | 0 | 0 | 0 | 0 | 0 |
| . | . | . | . | . | . | . | . | . | . | . |
| . | . | . | . | . | . | . | . | . | . | . |
| . | . | . | . | . | . | . | . | . | . | . |
| 0 | 0 | 0 | 0 | 1/2 | 0 | 0 | 0 | 0 | 0 | 0 |
| 0 | 0 | 0 | 0 | 0 | 0 | 0 | 0 | 0 | 0 | 0 |
| 0 | 0 | 0 | 0 | 0 | 0 | –1/2 | 0 | 0 | 0 | 0 |
| . | . | . | . | . | . | . | . | . | . | . |
| . | . | . | . | . | . | . | . | . | . | . |
| . | . | . | . | . | . | . | . | . | . | . |
| 0 | 0 | 0 | 0 | 0 | 0 | 0 | 0 | –L + 1 | 0 | 0 |
| 0 | 0 | 0 | 0 | 0 | 0 | 0 | 0 | 0 | –L + 1/2 | 0 |
| 0 | 0 | 0 | 0 | 0 | 0 | 0 | 0 | 0 | 0 | –L |

To understand the operation of the Quadratic Detector, it is useful to consider the following. A spread spectrum (CDMA) signal, s(t) is passed through a multipath channel with an impulse response $h_c(t)$. The baseband spread signal is described by equation (22).

$$s(t) = \sum_i C_i p(t - iT_c) \tag{22}$$

where $C_i$ is a complex spreading code symbol, p(t) is a predefined chip pulse and $T_c$ is the chip time spacing, where $T_c = 1/R_c$ and $R_c$ is the chip rate.

The received baseband signal is represented by equation (23)

$$r(t) = \sum_i C_i q(t - iT_c - \tau) + n(t) \tag{23}$$

where $q(t) = p(t) * h_c(t)$, $\tau$ is an unknown delay and n(t) is additive noise. The received signal is processed by a filter, $h_R(t)$, so the waveform, x(t), to be processed is given by equation (24).

$$x(t) = \sum_i C_i f(t - iT_c - \tau) + z(t) \tag{24}$$

where $f(t) = q(t) * h_R(t)$ and $z(t) = n(t) * h_R(t)$.

In the exemplary receiver, samples of the received signal are taken at the chip rate, that is to say, $1/T_c$. These samples, $x(mT_c + \tau')$, are processed by an array of correlators that compute, during the $r^{th}$ correlation period, the quantities given by equation (25)

$$v_k^{(r)} = \sum_{m=rL}^{rL+L-1} x(mT_c + \tau') C_{m-k}^* \tag{25}$$

These quantities are composed of a noise component $w_k^{(r)}$ and a deterministic component $y_k^{(r)}$ given by equation (26).

$$Y_k^{(r)} = E[V_k^{(r)}] = Lf(kT_c + \tau' - \tau) \tag{26}$$

In the sequel, the time index r may be suppressed for ease of writing, although it is to be noted that the function f(t) changes slowly with time.

The samples are processed to adjust the sampling phase, $\tau'$, in an optimum fashion for further processing by the receiver, such as matched filtering. This adjustment is described below. To simplify the representation of the process, it is helpful to describe it in terms of the function $f(t+\tau)$, where the time-shift, $\tau$, is to be adjusted. It is noted that the function $f(t+\tau)$ is measured in the presence of noise. Thus, it may be problematical to adjust the phase $\tau'$ based on measurements of the signal $f(t+\tau)$. To account for the noise, the function $v(t)$: $v(t)=f(t)+m(t)$ is introduced, where the term $m(t)$ represents a noise process. The system processor may be derived based on considerations of the function $v(t)$.

The process is non-coherent and therefore is based on the envelope power function $|v(t+\tau)|^2$ The functional $e(\tau')$ given in equation (27) is helpful for describing the process.

$$e(\tau') = \int_{-\infty}^{0} |v(t+\tau'-\tau)|^2 dt - \int_{0}^{\infty} |v(t+\tau'-\tau)|^2 dt \quad (27)$$

The shift parameter is adjusted for $e(\tau')=0$, which occurs when the energy on the interval $(-\infty, \tau'-\tau]$ equals that on the interval $[\tau'-\tau, \infty)$. The error characteristic is monotonic and therefore has a single zero crossing point. This is the desirable quality of the functional. A disadvantage of the functional is that it is ill-defined because the integrals are unbounded when noise is present. Nevertheless, the functional $e(\tau')$ may be cast in the form given by equation (28).

$$e(\tau') = \int_{-\infty}^{\infty} w(t)|v(t+\tau'-\tau)|^2 dt \quad (28)$$

where the characteristic function $w(t)$ is equal to $sgn(t)$, the signum function.

To optimize the characteristic function $w(t)$, it is helpful to define a figure of merit, F, as set forth in equation (29).

$$F = \frac{([e(\tau_0' + T_A) - e(\tau_0' - T_A)])^2}{VAR\{e(\tau_0')\}} \quad (29)$$

The numerator of F is the numerical slope of the mean error characteristic on the interval $[-T_A, T_A]$ surrounding the tracked value, $\tau_0'$. The statistical mean is taken with respect to the noise as well as the random channel, $h_c(t)$. It is desirable to specify a statistical characteristic of the channel in order to perform this statistical average. For example, the channel may be modeled as a Wide Sense Stationary Uncorrelated Scattering (WSSUS) channel with impulse response $h_c(t)$ and a white noise process $U(t)$ that has an intensity function $g(t)$ as shown in equation (30).

$$h_c(t) = \sqrt{g(t)} U(t) \quad (30)$$

The variance of $e(\tau)$ is computed as the mean square value of the fluctuation $$e'(\tau) = e(\tau) - \langle e(\tau) \rangle \quad (31)$$

where $\langle e(\tau) \rangle$ is the average of $e(\tau)$ with respect to the noise.

Optimization of the figure of merit F with respect to the function $w(t)$ may be carried out using well-know n Variational methods of optimization.

Once the optimal $w(t)$ is determined, the resulting processor may be approximated accurately by a quadratic sample processor which is to derived as follows.

By the sampling theorem, the signal $v(t)$, bandlimited to a bandwidth W may be expressed in terms of its samples as shown in equation (32).

$$v(t) = \Sigma v(k/W) \sin c[(Wt-k)\pi] \quad (32)$$

substituting this expansion into equation (z+6) results in an infinite quadratic form in the samples $v(k/W+\tau'-\tau)$. Making the assumption that the signal bandwidth equals the chip rate allows the use of a sampling scheme that is clocked by the chip clock signal to be used to obtain the samples. These samples, $v_k$ are represented by equation (33).

$$v_k = v(kT_c + \tau' - \tau) \quad (33)$$

This assumption leads to a simplification of the implementation. It is valid if the aliasing error is small.

In practice, the quadratic form that is derived is truncated. An example normalized B matrix is given below in Table 2. For this example, an exponential delay spread profile $g(t) = \exp(-t/T)$ is assumed with $\tau$ equal to one chip. An aperture parameter $T_A$ equal to one and one-half chips has also been assumed. The underlying chip pulse has a raised cosine spectrum with a 20% excess bandwidth.

TABLE 2

Example B matrix

| 0 | 0 | 0 | 0 | 0 | 0 | 0 | 0 | 0 | 0 | 0 |
|---|---|---|---|---|---|---|---|---|---|---|
| 0 | 0 | −0.1 | 0 | 0 | 0 | 0 | 0 | 0 | 0 | 0 |
| 0 | −0.1 | 0.22 | 0.19 | −0.19 | 0 | 0 | 0 | 0 | 0 | 0 |
| 0 | 0 | 0.19 | 1 | 0.45 | −0.2 | 0 | 0 | 0 | 0 | 0 |
| 0 | 0 | −0.19 | 0.45 | 0.99 | 0.23 | 0 | 0 | 0 | 0 | 0 |
| 0 | 0 | 0 | −0.2 | 0.23 | 0 | −0.18 | 0.17 | 0 | 0 | 0 |
| 0 | 0 | 0 | 0 | 0 | −0.18 | −0.87 | −0.42 | 0.18 | 0 | 0 |
| 0 | 0 | 0 | 0 | 0 | 0.17 | −0.42 | −0.92 | −0.16 | 0 | 0 |
| 0 | 0 | 0 | 0 | 0 | 0 | 0.18 | −0.16 | −0.31 | 0 | 0 |
| 0 | 0 | 0 | 0 | 0 | 0 | 0 | 0 | 0 | −0.13 | 0 |
| 0 | 0 | 0 | 0 | 0 | 0 | 0 | 0 | 0 | 0 | 0 |

Code tracking of the above form in a CDMA system employing a Pilot signal can be implemented via a loop phase detector that is implemented in a digital signal processing device (DSP) as follows. The vector y is defined as a column vector which represents the 11 complex output level values of the Pilot AVC 1711, and B denotes an 11×11 symmetric real valued coefficient matrix with predetermined values to optimize performance with the non-coherent Pilot AVC output values y. The output signal of the phase detector is given by equation (21).

The following calculations are then performed to implement a proportional plus integral loop filter and the VCO:

$$x[n] = x[n-1] + \beta \epsilon \quad (34)$$

$$z[n] = z[n-1] + x[n] + \alpha \epsilon \quad (35)$$

for $\beta$ and $\alpha$ which are constants chosen from modeling the system to optimize system performance for the particular transmission channel and application, and where x[n] is the loop filter's integrator output value and z[n] is the VCO output value. The code phase adjustments are made by the modem controller the following C-subroutine:
    if (z>zmx){
      delay phase 1/16 chip;
      z−=zmax;
    } else if (z<−zmax){
      advance phase 1/16 chip;
      z+=zmax;
    }
Determining the Minimum Value of L needed:

The value of L in the previous section determines the minimum number of correlators and sum-and-dump elements. L is chosen as small as possible without compromising the functionality of the tracking circuit.

The multipath characteristic of the channel is such that the received chip waveform f(t) is spread over $QT_c$ seconds, or the multipath components occupy a time period of Q chips duration. The value of L chosen is L=Q. Q is found by measuring the particular RF channel transmission characteristics to determine the earliest and latest multipath component signal propagation delay. $QT_c$ is the difference between the earliest and latest multipath component arrival time at a receiver.

Coherent Tracking:

The previous description of acquisition and tracking algorithm focuses on a non-coherent method because the acquisition and tracking algorithm described requires non-coherent acquisition following by non-coherent tracking because during acquisition a coherent reference is not available until the AMF, Pilot AVC, Aux AVC, and DPLL are in an equilibrium state. However, it is known in the art that coherent tracking and combining is always optimal because in non-coherent tracking and combining the output phase information of each Pilot AVC finger is lost. Consequently, another embodiment of the invention employs a two step acquisition and tracking system, in which the previously described non-coherent acquisition and tracking algorithm is implemented first, and then the algorithm switches to a coherent tracking method. The coherent combining and tracking method is similar to that described previously, except that the error signal tracked is of the form:

$$\epsilon = y^T A y \qquad (36)$$

where y is defined as a column vector which represents the 11 complex output level values of the Pilot AVC 1711, and A denotes an 11×11 symmetric real valued coefficient matrix with predetermined values to optimize performance with the coherent Pilot AVC outputs y. An exemplary A matrix is shown below.

$$A = \begin{pmatrix} 1 & 0 & 0 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 1 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & -1 & 0 & 0 & 0 & 0 \\ 0 & 0 & 0 & 0 & 0 & 0 & 0 & -1 & 0 & 0 & 0 \\ 0 & 0 & 0 & 0 & 0 & 0 & 0 & 0 & -1 & 0 & 0 \\ 0 & 0 & 0 & 0 & 0 & 0 & 0 & 0 & 0 & -1 & 0 \\ 0 & 0 & 0 & 0 & 0 & 0 & 0 & 0 & 0 & 0 & -1 \end{pmatrix} \qquad (37)$$

While the present invention has been described in terms of exemplary embodiments, it is understood by one skilled in the are that it may be practiced as described above with variations within the scope of the following claims.

What is claimed is:

1. A method for tracking multipath components of a spread spectrum signal, the spread spectrum signal having an associated chip code sequence, the method comprising:

receiving multipath components of the spread spectrum signal;

despreading a first and a second plurality of multipath components about a center code phase, the first plurality being a sequence of multipath components prior to the center code phase and the second plurality being a sequence of multipath components after the center code phase;

determining a first combined energy of the despread first plurality of multipath components;

determining a second combined energy of the despread second plurality of multipath components;

calculating a tracking delay based on a difference of the first and second combined energies;

adjusting the center code phase by said tracking delay whereby the center phase is not adjusted if the first combined energy equals the second combined energy; and weighting the first and the second plurality of multipath components prior to determining the first and the second combined energy such that multipath components of the first and the second plurality of multipath components further from the center code phase are provided a higher weighting value and the first combined energy is of the weighted despread first plurality of multipath components and the second combined energy is of the weighted despread second plurality of multipath components.

2. The method of claim 1, wherein the first and the second plurality of multipath components includes the received multipath components of the spread-spectrum signal for each chip of a continuous sequence of chips from the center code phase.

3. The method of claim 1 wherein the weighting values associated with each multipath component of the first and the second plurality of multipath components is based on squaring a difference between a delay associated with the respective multipath component and the center code phase.

4. The method of claim 1 wherein the first and the second plurality of multipath components includes the received multipath components of the spread-spectrum signal for each half chip of a continuous sequence of chips from the center code phase.

5. A device for tracking multipath components of a spread-spectrum signal, the spread-spectrum signal having an associated chip code sequence, the device comprising:

means for receiving multipath components of the spread-spectrum signal;

means for despreading a first and a second plurality of multipath components about a center code phase, the first plurality being a sequence of multipath components prior to the center code phase and the second plurality being a sequence of multipath components after the center code phase;

means for determining a first combined energy of the despread first plurality of multipath components;

means for determining a second combined energy of the despread second plurality of multipath components;

means for calculating a tracking delay based on a difference of the first and the second combined energies;

means for adjusting the center code phase by said tracking delay whereby the center code phase is not adjusted if the first combined energy equals the second combined energy; and means for weighting the first and the second plurality of multipath components prior to determining the first and the second combined energy such that multipath components of the first and the second plurality of multipath components further from the center code phase are provided a higher weighting value and the first combined energy is of the weighted despread first plurality of multipath components and the second combined energy is of the weighted despread second plurality of multipath components.

6. The device of claim 5 wherein the first and the second plurality of multipath components includes the received multipath components of the spread-spectrum signal for each chip of a continuous sequence of chips from the center code phase.

7. The device of claim 5 wherein said weighting means weights each multipath component of the first and the second plurality of multipath components by a weight based on a square of a difference between a delay associated with the respective multipath component and the center code phase.

8. The device of claim 5 wherein the first and the second plurality of multipath components includes the multipath components of the spread-spectrum signal for each chip of a continuous sequence of chips from the center code phase.

9. A device for tracking multipath components of a spread-spectrum signal, the spread-spectrum signal having an associated chip code sequence, the device comprising:

means for receiving multipath components of the spread-spectrum signal;

a first and a second correlation bank for despreading a first and second plurality of multipath components, respectively, the first plurality being a sequence of multipath components prior to a center code phase and the second plurality being a sequence of multipath components after the center code phase;

a first sum and dump bank coupled to a first calculator bank for determining a magnitude associated with each of the first plurality of the multipath components; and a first summer for adding the magnitudes of the first plurality of multipath components as a first combined energy;

a second sum and dump bank coupled to a second calculator bank for determining a magnitude associated with each of the second plurality of multipath components;

a second summer for adding the magnitudes of the second plurality of multipath components as the second combined energy;

an adder for calculating the difference of the first and the second combined energies as a tracking delay; and means for adjusting the center code phase by said tracking delay whereby the center code phase is not adjusted if the first combined energy equals the second combined energy.

* * * * *

UNITED STATES PATENT AND TRADEMARK OFFICE
CERTIFICATE OF CORRECTION

PATENT NO.    : 6,381,264 B1
DATED         : April 30, 2002
INVENTOR(S)   : Gary Lomp and Faith Ozluturk It is certified that error appears in the above-identified patent and that said Letters Patent is hereby corrected as shown below:

Title page,
Item [56], References Cited, after the last U.S. patent, "6,289,040 B1*, 9/2001, Molev-Shteiman, 375/149", insert:

-- FOREIGN PATENT DOCUMENTS
3743731A1    7/89    Germany
3743732A1    7/89    Germany
0464839A2    1/92    Europe
0526106A2    2/93    Europe
9307702      4/93    WIPO
0654913A2    5/95    Europe
0656716A1    6/95    Europe
0668662A1    8/95    Europe
9702675      1/97    WIPO --.

After the last cited "OTHER PUBLICATION", insert:

-- Raymond W. Nettleton, "Spectral Efficiency in Cellular Land-Mobile Communications: A Spread-Spectrum Approach", UMI Dissertation Information Service (1978) 204 pp.

"CDMA and ATM-zwei Technologien, ein Ziel", 2323 Telecom Report (Siemens) 18 (1995) Maerz/April, No. 2, Munchen, DE, pp. 60-63. --

UNITED STATES PATENT AND TRADEMARK OFFICE
CERTIFICATE OF CORRECTION

PATENT NO. : 6,381,264 B1
DATED : April 30, 2002
INVENTOR(S) : Gary Lomp and Faith Ozluturk It is certified that error appears in the above-identified patent and that said Letters Patent is hereby corrected as shown below:

Column 6,
Line 15, after the word "characteristics", delete "off(t)" and insert therefore -- of f(t) --.
Line 16, after the word "of", insert therefore -- f(t) --.

Column 7,
Line 56, after the word "circuit", delete "1t)".

Signed and Sealed this

Twelfth Day of November, 2002

*Attest:*

JAMES E. ROGAN
*Attesting Officer*    *Director of the United States Patent and Trademark Office*